United States Patent [19]

Fujishima et al.

[11] Patent Number: 5,126,921
[45] Date of Patent: Jun. 30, 1992

[54] ELECTRONIC COMPONENT AND A METHOD FOR MANUFACTURING THE SAME

[75] Inventors: Akira Fujishima, 710-5, Nakamaruko, Nakahara-ku, Kawasaki-shi, Kanagawa-ken, Japan; Shigeo Kondo, Hirakata, Japan

[73] Assignee: Akira Fujishima, Kawasaki, Japan

[21] Appl. No.: 725,345

[22] Filed: Jul. 3, 1991

[30] Foreign Application Priority Data

Jul. 6, 1990 [JP] Japan ................................. 2-180055
Nov. 29, 1990 [JP] Japan ................................. 2-335924

[51] Int. Cl.⁵ .......................... H01G 9/05; B01J 17/00
[52] U.S. Cl. .................................. 361/525; 29/25.03
[58] Field of Search .............. 29/25.03; 361/525, 526, 361/527, 321

[56] References Cited

U.S. PATENT DOCUMENTS

| | | | |
|---|---|---|---|
| 3,214,648 | 10/1965 | Ross et al. | 361/525 |
| 3,570,113 | 3/1971 | Chiba | 29/546 |
| 3,649,878 | 3/1972 | Schneider | 361/525 |
| 4,943,892 | 7/1990 | Tsuchiya et al. | 361/525 |

FOREIGN PATENT DOCUMENTS

| | | | |
|---|---|---|---|
| 33743 | 9/1978 | Japan | 29/25.03 |
| 43603 | 10/1981 | Japan | 29/25.03 |

Primary Examiner—Donald A. Griffin

[57] ABSTRACT

An electronic component such as a capacitor having a pair of electrodes interposing a dielectric layer and a photosensitive metal oxide semiconductor layer therebetween. The electronic component is formed by immersing the layered body of one electrode, the dielectric, and the metal oxide layer in an electroless plating catalytic solution to have the catalyst deposited on the metal oxide layer and then by forming an electrode on the catalyst layer. The catalyst can be deposited in a pattern by irradiating the metal oxide layer with light during immersing the body in the catalytic solution.

28 Claims, 8 Drawing Sheets

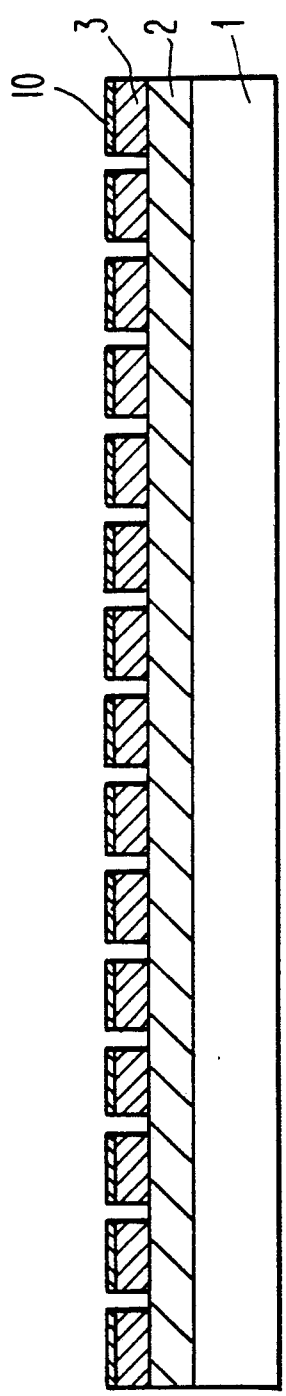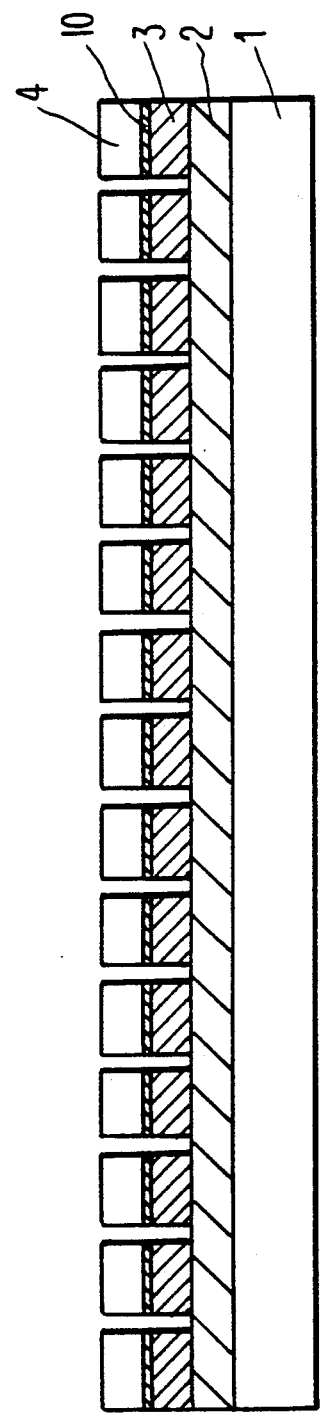

ELECTRONIC COMPONENT AND A METHOD FOR MANUFACTURING THE SAME

BACKGROUND OF THE INVENTION

1. Field of the Invention:

The present invention relates to an electronic component, such as a capacitor, and a method for manufacturing the same.

2. Description of the Prior Art:

A capacitor as an electronic component has the structure of a dielectric interposed between a pair of electrodes. As the dielectric, aluminum oxide, titanium oxide, tantalum oxide, or a plastic film is generally used. An aluminum capacitor, for example, is manufactured by the following method. First, an aluminum oxide layer is formed as a dielectric on an aluminum surface by electrochemical oxidation, then a manganese dioxide layer is formed on the aluminum oxide layer by thermal decomposition, and finally the manganese dioxide layer is coated with conductive carbon. Thus, the above aluminum capacitor has a structure of the aluminum oxide layer and the manganese dioxide layer as dielectrics interposed between the aluminum layer and the conductive carbon layer as electrodes.

Other methods for forming a conductive electrode on a dielectric than the above coating of conductive carbon have also been proposed, such as evaporation of a conductive material and electroless plating in which a conductive material is directly deposited on a dielectric.

In the electroless plating, however, it is difficult to deposit a conductive material on the manganese dioxide layer which is highly oxidative. To avoid this trouble, the conductive material may be deposited directly on the aluminum oxide layer. The aluminum oxide layer, however, does not allow the conductive material to be formed uniformly thereon. As a result, a capacitor thus obtained is not provided with stable characteristics, especially in leakage.

Therefore, an electrode of a capacitor is generally formed by coating conductive carbon or by evaporating conductive metal. However, a capacitor using conductive carbon as an electrode has an increased inductance at radio frequency, which makes it difficult to obtain an ideal performance of the capacitor. In recent years, a capacitor having a polypyrrole layer which is a conductive polymer formed between a dielectric and a conductive carbon layer has been developed in order to prevent the inductance increase at radio frequency and thereby to realize the coverage of a wider frequency range including radio frequency.

The above-mentioned capacitor having the polypyrrole layer may or may not have a manganese dioxide layer on the dielectric layer. In either case, the resultant capacitor shows excellent characteristics in the radio frequency range. The existence of a manganese dioxide layer as another dielectric advantageously compensates the insulation in the event of incomplete insulation by the dielectric aluminum oxide. This is further advantageous in that before being electrochemically polymerized the polypyrrole layer can be chemically oxidized due to the high oxidation property of manganese dioxide, allowing the conductive polypyrrole layer to attach further firmly to the dielectric. Thus, the formation of a manganese dioxide layer is important for high efficiency.

As mentioned above, the capacitor using polypyrrole as a conductive polymer can cover the radio frequency range, which is also possible in a ceramic capacitor, and has good mass-productivity. However, the heat resistance of the capacitor having the polymer electrode is as low as about 120° C. Therefore, enhancing the heat resistance is required in order to ensure high reliability.

Furthermore, in the recent advancement of electronic apparatuses, a variety of shapes, especially fine shapes of capacitors have been required. A manufacturing process of a fine-shaped capacitor generally requires a photolithograph step where a fine pattern is formed using a photoresist. In general, a fine-shaped capacitor is manufactured by the following process. First, the surface of a conductive substrate having an insulation formed thereon is coated with a photoresist, exposed to light through a mask having a desired pattern, and then subjected to development and etching, to obtain a conductive substrate having a finely shaped insulation thereon. An electrode is then formed corresponding to the shape of the insulation, thus to manufacture a fine-shaped capacitor.

In the photolithograph step for fine shaping of a capacitor, an organic photoresist is generally used. In this case, a large quantity of volatile organic solvents having a low boiling point, such as acetone, isopropyl alcohol, toluene, xylene, and Freon (trademark), are used when the resist is applied or removed. Therefore, careful control for exhaust gas is required in the steps using these solvents. In particular, in recent years, the atmospheric pollution by exhaust gas, especially by Freon (trademark) has given rise a problem on a global scale.

In a ceramic capacitor, a microwave element, and the like using ceramic as a dielectric, electroless plating is generally used for forming an electrode, in which metal such as copper and nickel is deposited on the ceramic surface to form an electrode.

A conventional method for forming an electrode on barium titanate, one of typical ceramic materials, is described below.

First, a ceramic substrate mainly composed of barium titanate is degreased with an alkaline solution. After a complete cleaning off of the alkaline solution, the surface of the ceramic substrate is roughened by etching with hydrofluoric acid. Next, after a complete cleaning off of the etchant, two catalyst-providing steps, that is, sensitizing and activating, are performed. Then, the ceramic substrate is washed with water and then subjected to electroless plating so as to deposit metal on the ceramic surface for forming an electrode. The first catalyst-providing step of sensitizing uses a tin chloride/hydrochloric acid solution, and the second catalyst-providing step of activating uses a palladium chloride/hydrochloric acid solution. In the latter activating step, it is considered that a bivalent tin ion existing on the ceramic surface is oxidized into a tetravalent tin ion, while at the same time a bivalent palladium ion is reduced into palladium metal which attaches to the surface.

The deposited conditions of metal such as copper and nickel on the ceramic surface having palladium metal deposited thereon, especially adhesion strength of the metal to the ceramic surface, greatly depends on whether the tin chloride has been tightly attached to the ceramic surface. The above roughening of the ceramic surface is made to increase the adhesion strength. This roughening also contributes to attaining uniform electrical characteristics of a capacitor or a microwave element manufactured.

As described above, degreasing and roughening of a ceramic surface are required for forming an electrode thereon. However, excessive roughening will weaken the ceramic itself. Further, the treatment liquid may be left inside the cavities of the excessively roughened surface, causing it to lessen the adhesion strength of the deposited metal to the surface. The remaining liquid in the cavities may also corrode the deposited metal. Moreover, the hydrofluoric acid used for etching is hazardous, requiring careful handling. For the above reasons, a technique which can eliminate the roughening and which can provide high adhesion strength of the electrode to the ceramic surface and stabilize the electrical characteristics is required.

SUMMARY OF THE INVENTION

The electronic component of the present invention, which overcomes the above-discussed and numerous other disadvantages and deficiencies of the prior art, comprises a dielectric layer, a metal oxide semiconductor layer as a photosensitive material formed on the dielectric layer, and a first electrode and a second electrode interposing the dielectric layer and the metal oxide semiconductor layer.

In a preferred embodiment, the electronic component is a capacitor.

In a preferred embodiment, the first electrode is an aluminum substrate, and the dielectric layer is an aluminum oxide layer formed on the aluminum substrate.

In a preferred embodiment, the metal oxide semiconductor layer is formed by thermal decomposition of an organic metal compound.

In a preferred embodiment, the metal oxide semiconductor layer is a zinc oxide layer.

In a preferred embodiment, a manganese dioxide layer is formed between the aluminum oxide layer and the zinc oxide layer.

In a preferred embodiment, the second electrode is copper.

In a preferred embodiment, the second electrode is conductive carbon.

In a preferred embodiment, the metal oxide semiconductor layer is a tungsten oxide layer.

In a preferred embodiment, the metal oxide semiconductor layer is a titanium oxide layer.

In a preferred embodiment, the second electrode is a layered structure of a conductive polymer layer and a conductive carbon layer.

In a preferred embodiment, an electroless plating catalyst layer is formed between the metal oxide semiconductor layer and the second electrode.

In a preferred embodiment, the electroless plating catalyst is palladium.

In a preferred embodiment, the dielectric layer is ceramic.

In a preferred embodiment, the dielectric layer is ceramic and the electronic component is a capacitor.

In a preferred embodiment, the electronic component is a microwave dielectric resonator.

According to another aspect of the present invention, a method for manufacturing an electronic component is provided which comprises the steps of forming a dielectric layer and a metal oxide semiconductor layer as a photosensitive material on an electrode substrate in this order, immersing the layered substrate in an electroless plating catalytic solution so as to deposit the electroless plating catalyst on the metal oxide semiconductor layer, and forming an electrode on the deposited catalyst.

In a preferred embodiment, the immersing step includes irradiating the metal oxide semiconductor layer with light having energy greater than the band gap thereof through a mask having a pattern so as to deposit the electroless plating catalyst in the pattern.

In a preferred embodiment, the electronic component is a capacitor.

In a preferred embodiment, the electrode substrate is a conductive metal substrate, and the dielectric layer is an oxide layer obtained by oxidation of the conductive metal.

In a preferred embodiment, the dielectric layer is a ceramic layer.

In a preferred embodiment, the electroless plating catalyst is palladium.

In a preferred embodiment, the metal oxide semiconductor layer is formed on the dielectric layer by thermal decomposition of an organic metal compound.

In a preferred embodiment, the electrode is formed by depositing metal on the deposited catalyst by immersing the layered substrate in an electroless plating solution.

In a preferred embodiment, the electrode is formed by applying conductive carbon to the deposited catalyst by screen printing.

Alternately, the method for manufacturing an electronic component comprises the steps of forming a dielectric layer and a metal oxide semiconductor layer as a photosensitive material on an electrode substrate in this order and immersing the layered substrate in an electroless plating solution containing a monomer under irradiation of light having energy greater than the band gap of the metal oxide semiconductor layer through a mask having a pattern so as to deposit a conductive polymer on a predetermined portion of the metal oxide semiconductor layer.

In a preferred embodiment, the electronic component is a capacitor.

In a preferred embodiment, the metal oxide semiconductor layer is a titanium oxide layer, and the monomer is pyrrole.

When the metal oxide semiconductor as a photosensitive material is irradiated with light having energy greater than the band gap, the radiated light energy is charge-separated into holes and electrons inside the semiconductor. When this separation is brought about in an electrolyte, the holes or electrons formed on the surface of the semiconductor cause opto-electrochemical oxidation or reduction. This reaction is utilized for the formation of a variety of electrodes.

Further, since the electronic component of this invention is formed by utilizing the opto-electrochemical reaction of the metal oxide semiconductor layer as a photosensitive material, the electrode is formed in tight contact with the metal oxide semiconductor layer along the uneven surface thereof, keeping a low resistance between the electrode and the dielectric.

Thus, the present invention makes possible the objectives of providing capacitors, for example, which can be formed in various shapes without a photolithograph step and which can show excellent characteristics in the radio frequency range.

Furthermore, when a ceramic is used as a dielectric and palladium as an electroless plating solution catalyst, the metal oxide semiconductor layer formed on the ceramic is dissolved as a metallic complex into an activator palladium catalytic solution when immersed therein. At the same time, a bivalent palladium ion is reduced into palladium metal by an electron formed on the surface of the metal oxide semiconductor layer to be deposited thereon. Then, the electrode is formed, for example, by metal deposition in an electroless plating solution.

Thus, the present invention also makes possible the objective of providing a method for manufacturing an electronic component which eliminates the step of using a highly corrosive solution such as hydrofluric acid, ensuring manufacture of an electronic component with high reliability.

BRIEF DESCRIPTION OF THE DRAWINGS

This invention may be better understood and its numerous objects and advantages will become apparent to those skilled in the art by reference to the accompanying drawings as follows:

FIGS. 3(a) and 3(b) are sectional views showing steps for manufacturing the capacitor of FIG. 1, respectively;

DESCRIPTION OF THE PREFERRED EMBODIMENT

Figure 1:
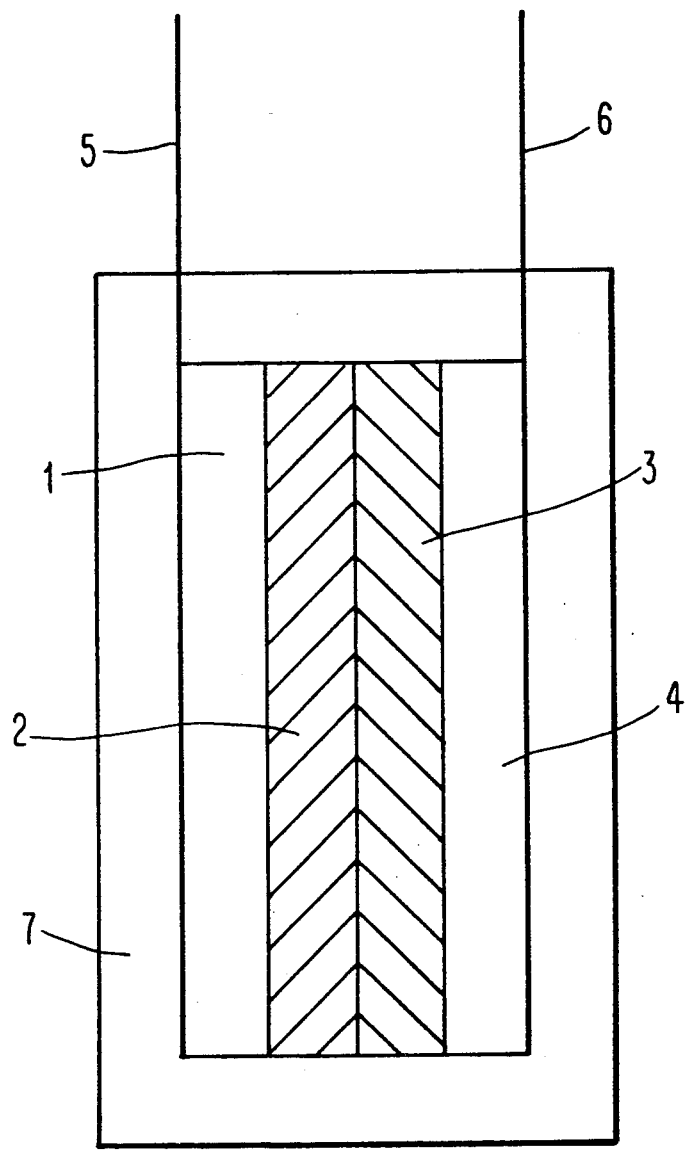
FIG. 1 is a sectional view showing a capacitor as an electronic component according to the present invention.

A method for manufacturing an electronic component according to this invention in the case of manufacturing an aluminum capacitor using an n-type semiconductor is described below.

First, an aluminum oxide layer as a dielectric is formed on an aluminum substrate by electrochemical oxidation, and an n-type metal oxide semiconductor layer of, for example, zinc oxide, is formed on the aluminum oxide layer. Then, the layered substrate is immersed in an electroless plating catalytic solution such as an aqueous solution of palladium chloride, and then irradiated with light having energy greater than the band gap of the n-type semiconductor layer so as to obtain a desired pattern thereon. In the light-exposed portion of the semiconductor layer, charges are separated to generate holes and electrons. The holes generated act to oxidize the semiconductor layer, causing most of the semiconductor layer to dissolve into the solution by opto-electrochemical reaction. At the same time, a bivalent palladium (Pd) ion, for example, is reduced to deposit palladium metal on the portion of the semiconductor layer which has not been exposed to light. Then, as a final stage, deposition of conductive metal such as copper and nickel in an electroless plating solution is performed to form an electrode having the desired pattern.

Normally, in the case of Pd deposition on a metal oxide semiconductor layer, sensitizing is performed prior to the Pd deposition, in which a sensitizer containing tin chloride or the like is attached to the surface of the semiconductor layer. Without the existence of tin, favorable Pd deposition will not be possible.

As an electroless plating catalyst, other metal than Pd, such as Pt, Ag, and Au, which can be opto-electrochemically deposited, may be used. Also, any palladium catalytic solution which is conventionally used as an activator for electroless plating may be used, including, typically, an aqueous solution of palladium chloride or palladium sulfate.

The metal oxide semiconductor layer may directly be contacted with the dielectric metal oxide (aluminum oxide) as the above case, or a layer of a second metal oxide such as manganese dioxide may be interposed therebetween.

Next, the case of using ceramic as a dielectric is described.

First, an n-type metal oxide semiconductor layer is formed on a ceramic substrate. When zinc oxide is used as the metal oxide semiconductor, the zinc oxide is formed on the ceramic substrate by sputtering using Zn as a target in the oxygen-containing atmosphere, by sputtering using ZnO as a target, by a CVD or other method using an organic zinc compound such as dimethylzinc or diethylzinc, or the like. Preferably, a liquid of an organic zinc compound such as an ethanol solution of zinc acetate and a hexane solution of dimethylzinc or diethylzinc, or a liquid organic zinc compound such as dimethylzinc and diethylzinc, is used to immerse the ceramic substrate therein, or, such a liquid is applied to the ceramic substrate and then decomposed by heating to obtain zinc oxide. Alternately, the ceramic substrate is preferably exposed in the steam of such an organic zinc compound as mentioned above to have the organic zinc compound attached thereto and then heated to obtain a zinc oxide layer thereon. When liquid or gaseous organic zinc compound is used, at least part of the formed zinc oxide layer penetrates into fine cavities on the ceramic substrate, which provides an anchor effect to a metal electrode to be later deposited thereon by electroless plating, giving the metal electrode high adhesion strength to the ceramic substrate.

The heating temperature to obtain zinc oxide differs depending on the type of the used zinc compound. Generally, 100° C. or more is advantageous in view of crystallinity, though in some cases the zinc oxide layer can be formed at a temperature below 100° C.

The zinc oxide layer may contain other metal oxides, other zinc compounds, decomposed residues of the zinc compounds, or the like as far as they do not impede the objectives of the present invention.

Other p-type or n-type metal oxide semiconductors, preferably titanium oxide and tungsten oxide, than the above zinc oxide can be used. A metal oxide semiconductor layer of titanium oxide, tungsten oxide, or the like may be formed by the same process as the case of zinc oxide described above. When it is formed by thermal decomposition of an organic metal compound, lower titanium alkoxide including titanium tetraethoxide and titanium tetraisopropoxide, tungsten pantasthoxide, or other liquid compounds at normal temperature or solid compounds at normal temperature which can be made into a solution by an appropriate catalyst are used as far as they are thermally decomposed to form an oxide. Likewise, inorganic solutions such as an ammonia solution of zinc oxide, a hydrolysate of titanium tetrachloride, and an aqueous solution of WBr or WCl can also be used.

In most cases of using an n-type metal oxide semiconductor as a photosensitive material, when immersed in a solution and irradiated with light, the semiconductor is oxidized and dissolved into the solution. However, some semiconductors such as titanium oxide are not relatively dissolved. In this case, a substance which is easily oxidized present in the solution is oxidized by holes generated on the surface of the semiconductor. Hence, a monomer such as pyrrole and aniline which can form a conductive substance by anodic oxidation may be contained in the solution as an easily-oxidized substance so as to directly deposit a conductive polymer on a light-exposed portion of the semiconductor. Using this process, conductive polymers of various shapes are easily formed, thus making it possible to easily manufacture an electronic component such as a capacitor having a different shape of conductive polymer as an electrode.

In the case of using a p-type metal oxide semiconductor such as indium phosphide (InP) or strontium titanate as a photosensitive material, a light-exposed portion of the semiconductor is reduced, not dissolved into the solution. Therefore, in the electrode forming step, nickel or copper ions selectively attach to the light-exposed portion to form an electrode.

A xenon lamp or a mercury lamp is used as a light source having energy greater than the band gap of the metal oxide semiconductor.

Dielectric ceramic materials generally used in conventional electronic components can be used in this invention. For example, $(Mg_{1-x}Ca_x)TiO_3$ as a main ingredient with Pd, Mn, Ni, or the like added thereto is typical as a material having a low dielectric constant, complex perovskite type oxides such as $Ba(Zn,Ta)O_3$ compounds represented by $BaO-TiO_2$ and $BaZn_{1/3}Ta_{2/3}O_3$ as a material having a dielectric constant of around 40, and $BaO.TiO_2$ ternary system oxides including rare earth oxide as a material having a dielectric constant in the range of 70 to 90. Using barium titanium is preferable for a capacitor and a microwave element.

The shape of the ceramic used in this invention is not particularly limited, and a molded shape corresponding to the type of an electronic component applied may be used.

EXAMPLE 1

Referring to FIG. 1, the capacitor comprises an aluminum substrate 1 as a conductive electrode substrate. On the aluminum substrate 1 are formed an aluminum oxide layer 2 as a dielectric and a zinc oxide layer 3 as a photosensitive n-type semiconductor in this order. Then, a conductive electrode 4 made of copper is formed on the zinc oxide layer 3. An anode lead 5 is connected to the aluminum substrate 1 and a cathode lead 6 to the conductive electrode 4. The aluminum substrate 1, the aluminum oxide layer 2, zinc oxide layer 3, and the conductive electrode 4 are all enclosed by a seal 7 made of thermosetting epoxy resin.

The capacitor of the above structure was manufactured as follows. First, the aluminum substrate 1 having a size of 296 mm × 210 mm and a thickness of 50 μm was subjected to anodic oxidation with 2 mA/cm² current in an electrolyte containing ammonium borate as a main ingredient so as to form the aluminum oxide layer 2 as a dielectric on the surface thereof.

Next, the substrate 1 having the aluminum oxide layer 2 formed thereon was coated with an ethanol solution of zinc acetate (0.05 mol/dm³) by spraying, and then heated to 300° C. in the atmosphere, so that the zinc acetate was decomposed to obtain the zinc oxide layer 3 formed as an n-type photosensitive semiconductor on the aluminum oxide layer 2.

Figure 2:
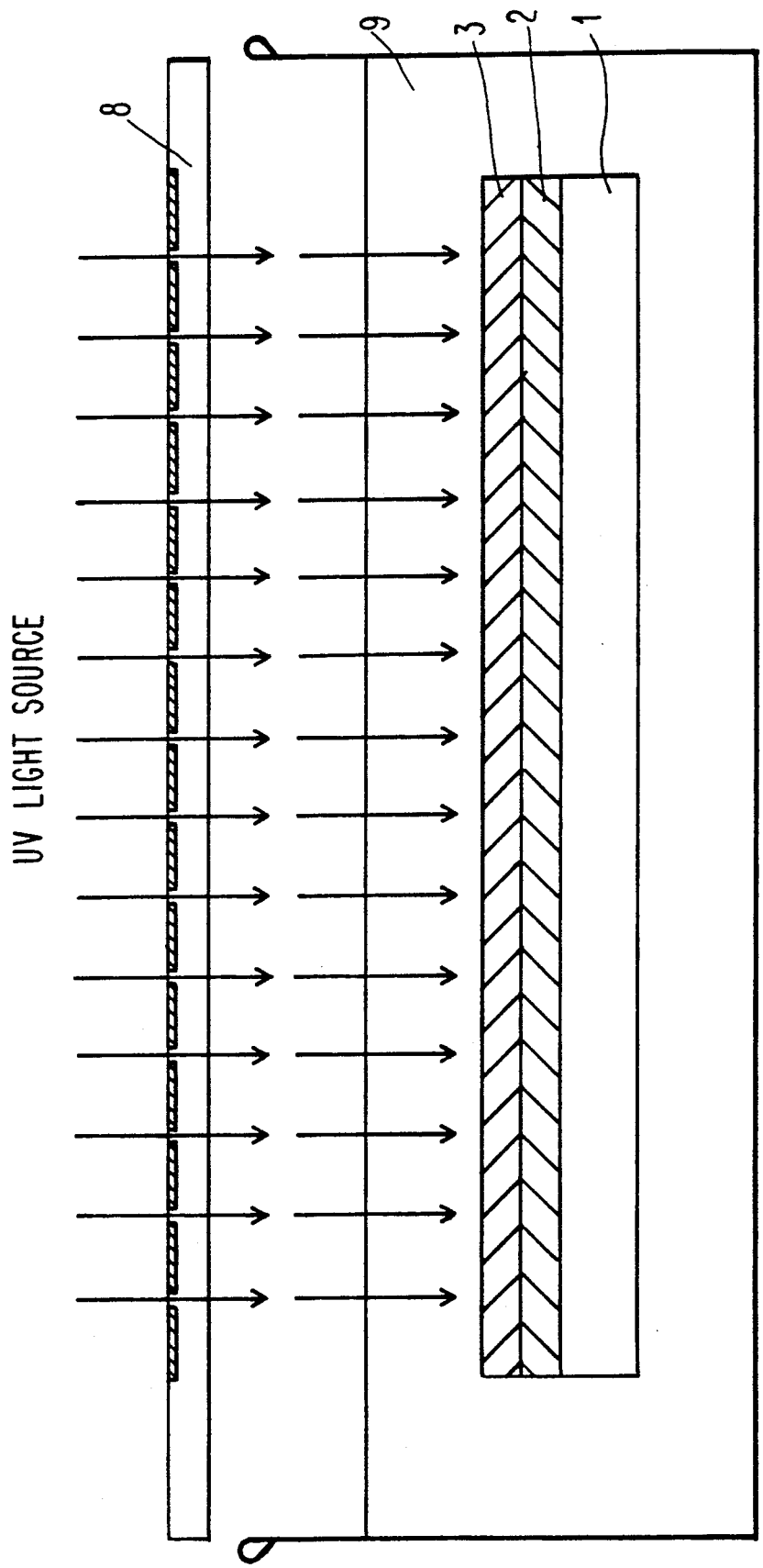
FIG. 2 is a sectional view showing a step for manufacturing the capacitor of FIG. 1.

Then, as shown in FIG. 2, the layered substrate was immersed in an electroless plating catalytic (Pd) solution 9, and the photosensitive zinc oxide layer 3 was irradiated with ultraviolet light from an ultraviolet light lamp having energy greater than the band gap of the zinc oxide layer 3 through a photomask 8 of a glass substrate. The photomask 8 has a pattern designed to be non-transparent or transparent to light so that a desired size of capacitor portions and a desired gap therebetween (in this example, 5 mm × 5 mm and 1 mm, respectively) can be formed. As a result, a light-exposed portion of the zinc oxide layer was dissolved into the solution, and, as shown in FIG. 3(a), an electroless plating catalyst (Pd) layer 10 was deposited on the portion of the zinc oxide layer 3 which had not been exposed to light.

Subsequently, the layered substrate was immersed in an electroless plating copper solution, and, as shown in FIG. 3(b), copper was deposited on the catalyst (Pd) deposited portion. Thus, the conductive electrode 4 of the desired pattern was obtained.

The layered substrate formed by the above process was then cut along the pattern of the conductive electrode 4 to form individual small elements. Then, aluminum oxide was removed from the aluminum substrate 1, to which the tinning anode lead 5 was connected with a conductive silver paste. Likewise, the tinning cathode lead 6 was connected to the conductive electrode 4 with the conductive silver paste. The element formed in this way was then enclosed by the seal 7 made of epoxy resin so as to form the capacitor shown in FIG. 1.

Figure 4:
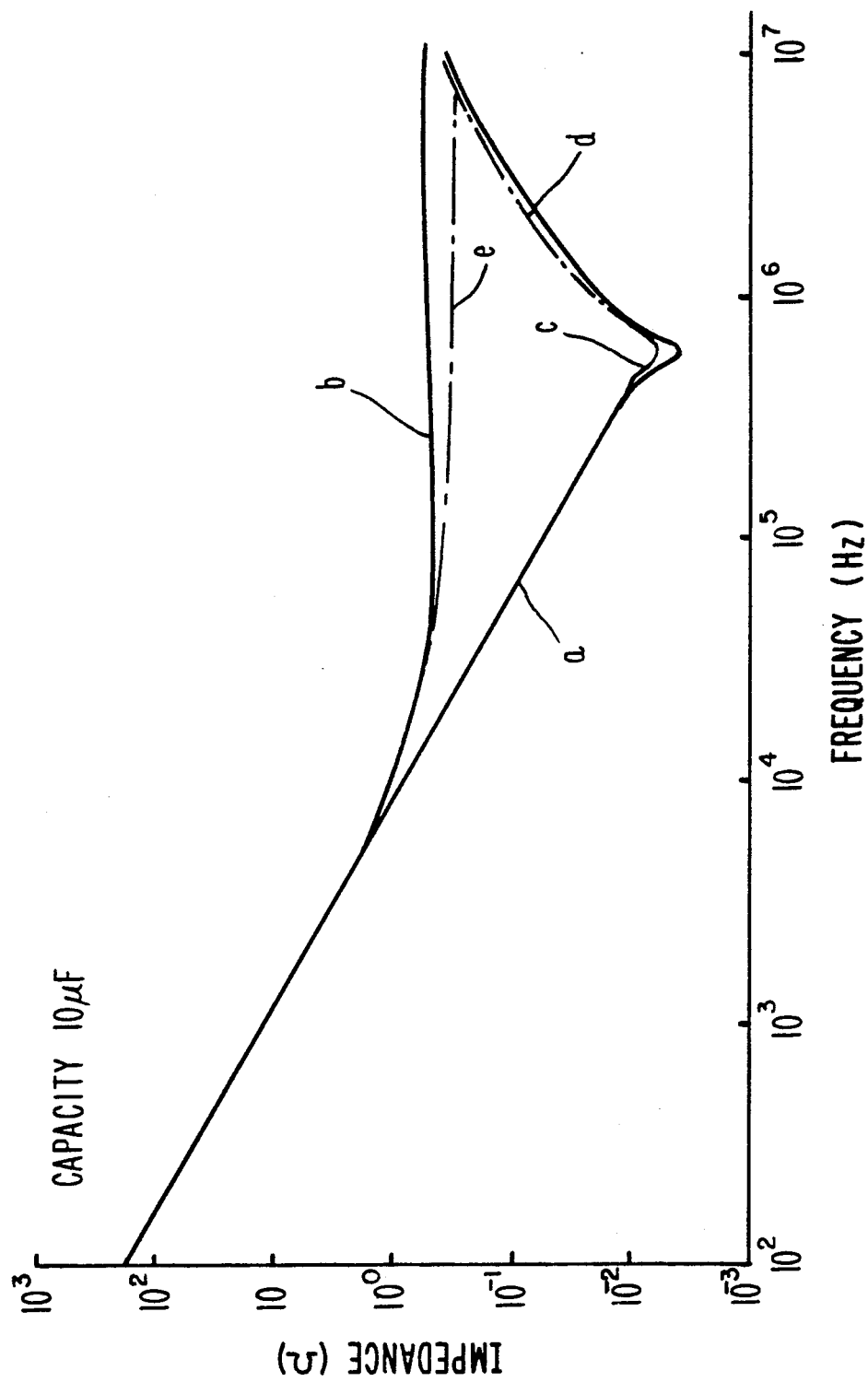
FIG. 4 is a graph showing the frequency characteristics of the capacitor of the present invention and a conventional capacitor.

The frequency characteristic of the capacitor manufactured by the above process is shown by the solid line a in FIG. 4. For comparison, the characteristic of a conventional aluminum capacitor is shown by the solid line b, together with the characteristics of an aluminum capacitor with a polypyrrole electrode, a ceramic capacitor, and a tantalum capacitor by the solid fine line c, the one-dot dash line d, and the one-dot dash line e, respectively.

As is apparent in FIG. 4, the capacitor of this invention shows substantially the same excellent characteristics at radio frequency as the ceramic capacitor.

Figure 5:
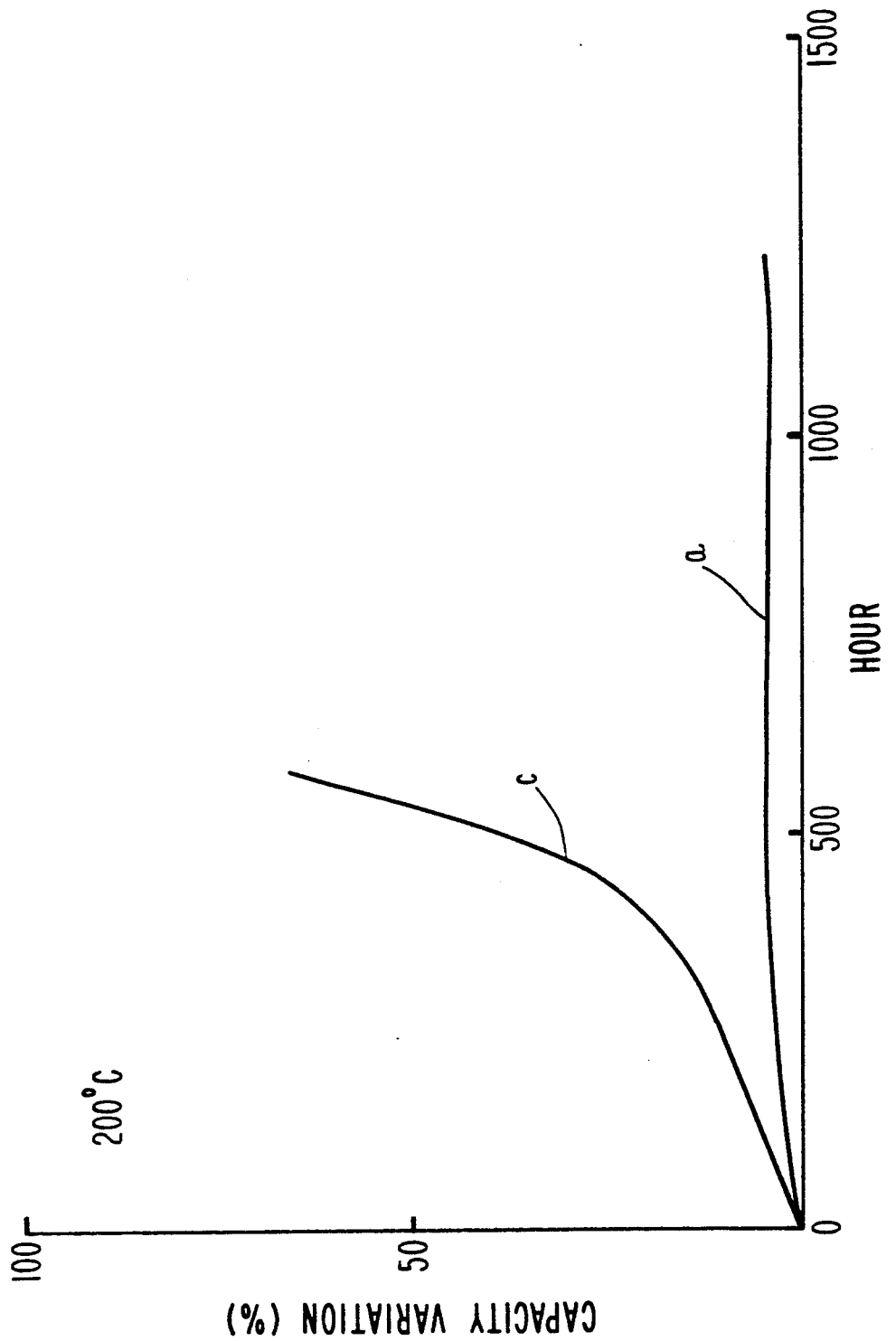
FIG. 5 is a graph showing the relationship between the capacity variation and the time at high temperature of the capacitor of the present invention and a conventional capacitor.

FIG. 5 illustrates the characteristics at 200° C. of the capacitor of this invention (line a) and a conventional aluminum capacitor (line c), which clearly shows the excellence of the capacitor of this invention in the high temperature range. This is probably because the capacitor of this invention is composed of inorganic materials having good heat resistance.

EXAMPLE 2

In this example, a capacitor was manufactured by the same process described in Example 1, except that after the aluminum oxide layer 2 was formed on the aluminum substrate 1, a conductive manganese oxide layer was formed on the aluminum oxide layer 2 by thermal decomposition. Then, the zinc oxide layer 3 was formed on the manganese oxide layer.

The capacitor obtained in this example showed substantially the same characteristics as the capacitor of Example 1.

EXAMPLE 3

In this example, a capacitor was manufactured by the same process as Example 2, except that the conductive electrode 4 was formed by carbon application by screen printing, instead of copper deposition by electroless plating.

The capacitor obtained in this example showed substantially the same characteristics as the capacitor of Example 2.

EXAMPLE 4

In this example, a capacitor was manufactured by the same process as Example 1, except that an n-type semiconductor tungsten oxide was used as the photosensitive layer. The manufacturing process of this example is described as follows.

First, an aluminum substrate having a size of 10 mm × 10 mm and a thickness of 50 $\mu$m was subjected to anodic oxidation with 2 mA/cm$^2$ current in an electrolyte containing ammonium borate as a main ingredient so as to form the aluminum oxide layer 2 as a dielectric on the surface thereof.

Next, the substrate having the aluminum oxide layer 2 formed thereon was coated with an aqueous solution of peroxopolytungstate, which had previously been prepared, by spraying and then heated to 180° C. in the atmosphere, so that a tungsten oxide layer as an n-type photosensitive semiconductor was formed on the aluminum oxide layer 2.

Then, the layered substrate was immersed in an electroless plating catalytic (Pd) solution in the same manner as Example 1, and the photosensitive tungsten oxide layer was irradiated with ultraviolet light having energy greater than the band gap of the tungsten oxide layer through a photomask of a glass substrate. The photomask has a pattern designed to have a desired size of capacitor portions (in this example, 4 mm × 4 mm) arranged at intervals of 1 mm. As a result, the light-exposed portion of the tungsten oxide layer was dissolved into the solution, and the catalyst (Pd) was deposited on the portion of the tungsten oxide layer which had not been exposed to light.

Subsequently, the layered substrate was immersed in an electroless plating copper solution, and copper was deposited on the Pd deposited portion. Thus, the conductive electrode 4 of the desired pattern was obtained.

The layered substrate formed by the above process was then cut along the pattern of the conductive electrode 4 to form individual small elements. Then, aluminum oxide was removed from the aluminum substrate, to which the tinning anode lead 5 was connected with a conductive silver paste. Likewise, the tinning cathode lead 6 was connected to the conductive electrode 4 with the conductive silver paste. The element formed in this way was then enclosed by the seal 7 made of epoxy resin finally to form the capacitor of this example.

The capacitor obtained in this example was tested and showed substantially the same results as those of the capacitor of Example 1.

EXAMPLE 5

In this example, a capacitor was manufactured by using titanium oxide as an n-type photosensitive semiconductor and also using a conductive polymer as a conductive electrode instead of metal. The manufacturing process of this example is described as follows.

First, the aluminum substrate having a size of 10 mm × 10 mm and a thickness of 50 $\mu$m was subjected to anodic oxidation with 2 mA/cm$^2$ current in an electrolyte containing ammonium borate as a main ingredient so as to form the aluminum oxide layer 2 as a dielectric on the surface thereof.

Next, the substrate having the aluminum oxide layer 2 formed thereon was immersed in a solution of 50% titanium tetraisopropoxide/isopropyl alcohol, cleaned by immersing in distilled water, and then fired at 450° C., so that a titanium oxide layer as an n-type photosensitive semiconductor was formed on the aluminum oxide layer 2.

Polypyrrole was used as a conductive polymer, and alkylnaphthalene sulfonate soda as a supporting electrolyte containing 1% pyrrole was used as an electrolyte. The layered substrate was immersed in this electrolyte and the photosensitive titanium oxide layer was irradiated with ultraviolet light through a photomask having a reverse pattern to that of the former examples. Thus, the pyrrole was oxidized on the light-exposed portion of the titanium oxide layer, so that polypyrrole was deposited by opto-electrochemical polymerization in a predetermined pattern. During this process, electrochemical polymerization may also be performed by applying outer pressure to accelerate the deposition of polypyrrole.

Then, after the layered substrate taken out from the electrolyte was cleaned and dried, an electrode was formed using conductive carbon. The layered substrate was then cut into individual capacitor elements.

The capacitor obtained in this example was tested, and showed the same frequency characteristics as the conventional capacitors using pyrrole.

EXAMPLE 6

In Examples 1 to 5, aluminum capacitors were described. This example refers to a tantalum capacitor. The manufacturing process of a tantalum capacitor is described as follows.

First, a tantalum substrate having a size of 10 mm × 10 mm and a thickness of 50 $\mu$m was subjected to electrolytic oxidation in an electrolyte so as to form a tantalum oxide layer as a dielectric on the surface thereof.

Next, the substrate having the tantalum oxide layer formed thereon was immersed in a solution of 50% titanium tetraisopropoxide/isopropyl alcohol, cleaned by immersing in distilled water, and then fired at 450° C., so that a titanium oxide layer as an n-type photosensitive semiconductor was formed on the tantalum oxide layer.

Then, polypyrrole was opto-electrochemically deposited on the titanium oxide layer as a conductive polymer in the same manner as Example 5.

After the layered substrate taken out from the electrolyte was cleaned and dried, an electrode was formed using conductive carbon. The body was then cut into individual capacitor elements.

The capacitor obtained in this example was tested, and showed substantially the same excellent characteristics in the radio frequency range as that of a ceramic capacitor, which is not possible for conventional tantalum capacitors.

EXAMPLE 7

In this example, a ceramic capacitor is described.

Figure 6A:
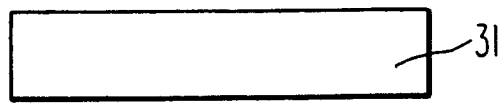
FIGS. 6(a) to 6(c) are sectional views showing the steps for manufacturing a ceramic capacitor as an electronic component according to the present invention, respectively.
Figure 6B:
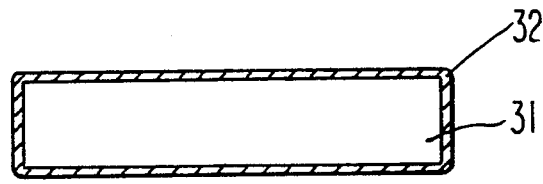

FIGS. 6(a) to 6(e) illustrated the steps for manufacturing the ceramic capacitor. FIG. 6(a) shows a ceramic substrate 31 having a thickness of about 1 mm and a diameter of 10 mm mainly made of barium titanate. This substrate 31 was immersed in a 0.05 mol zinc acetate/ethanol solution, and then oxidized at 280° C. so as to form a zinc oxide layer 32 thereon as an oxide semiconductor layer, as shown in FIG. 6(b). In this stage, the zinc acetate may completely be thermaldecomposed to obtain the zinc oxide, or may be thermal-treated at a comparatively low temperature of 150° C. to obtain non-reacted zinc.

Figure 6C:
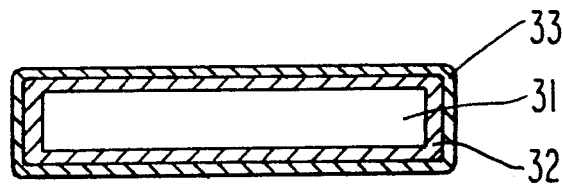

Next, the ceramic substrate 31 with the zinc oxide layer 32 formed thereon was immersed in an aqueous solution of $5 \times 10^{-4}$ mol palladium chloride/hydrochloric acid as an activator so as to deposit a palladium layer 33 on the zinc oxide layer 32, as shown in FIG. 6(c).

Figure 6D:
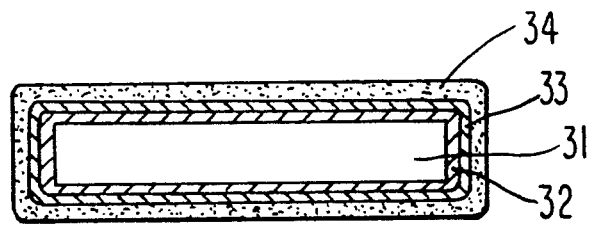
Figure 6E:
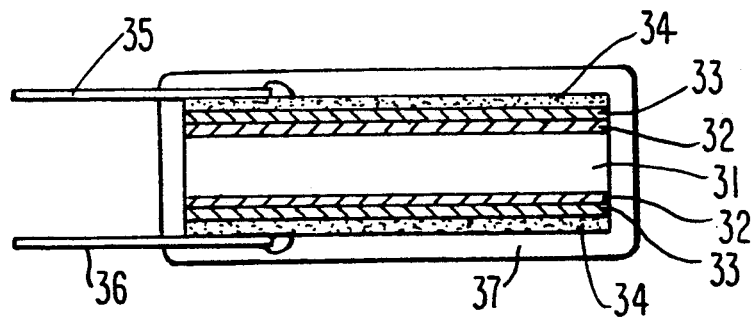

The substrate 31 with the palladium layer 33 deposited thereon was then immersed in an electroless plating solution so as to chemically deposit copper to form a copper layer 34 thereon, as shown in FIG. 6(d). The copper layer 34 was thickened by electroplating in an electroplating solution containing copper pyrophosphate as a main ingredient. Then, both side ends of the layered ceramic substrate were cut off and polished to form a ceramic capacitor element having a pair of copper electrodes 34 sandwiching the ceramic substrate.

Then, tin plating leads 35 and 36 were connected to the copper electrodes 34 by soldering, respectively, and the entire capacitor element was sealed with a thermosetting epoxy resin 37 to obtain a capacitor.

The capacitor obtained in this example was tested to check the adhesion strength of the electrodes 34 to the ceramic substrate 31, and the result was 20 kg/100 mm². The adhesion strength of a ceramic capacitor manufactured by a conventional process as a comparative example was 15 kg/100 mm². Further, as a second comparative example, a capacitor was manufactured by forming tin oxide and then palladium on a ceramic substrate without roughening the substrate with hydrofluoric acid and then by forming a copper electrode. The adhesion strength of this comparative example was 0 to 1 kg/100 mm².

Then, tan δ (dielectric dissipation factor), an important electric characteristic of the capacitor, and its capacitance were measured for the above three samples. The values of tan δ at a temperature of 25° C. and a frequency of 1 khz were 0.51, 0.85, and 1.1, respectively. The capacitances of these three samples showed roughly the same values, that is, 239, 235, and 237, respectively. As a result, the capacitor of this example was proved to show the most excellent characteristics (tan δ).

EXAMPLE 8

In this example, a ceramic capacitor of which electrode is formed by an opto-electrochemical method is described.

The ceramic substrate 31 mainly made of barium titanium used in Example 7 was immersed in an ethanol solution of zinc acetate (0.05 mol/dm³), and then heated to 400° C. in the atmosphere to decompose the zinc acetate so as to form the zinc oxide layer 32 as an n-type photoconductive semiconductor on the substrate 31.

Figure 7A:
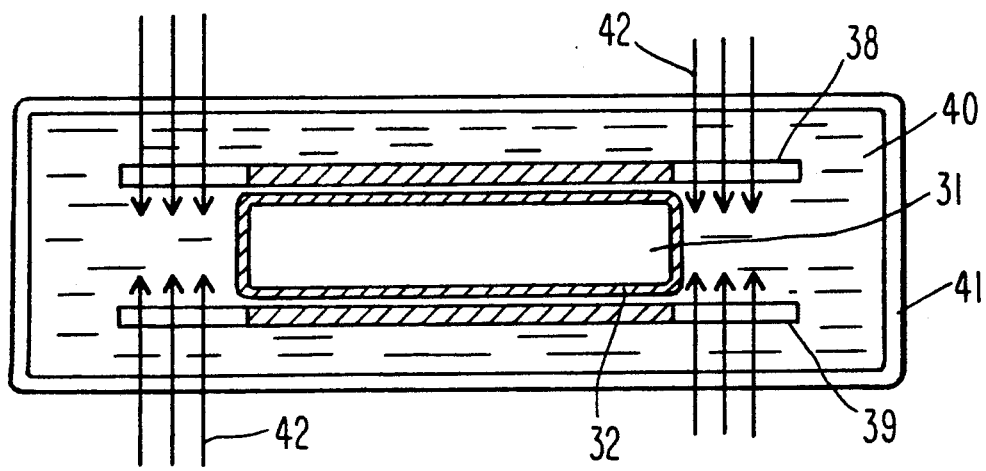
FIGS. 7(a) and 7(b) are a sectional view and a plan view, respectively, showing a step for manufacturing a ceramic capacitor according to the present invention.
Figure 7B:
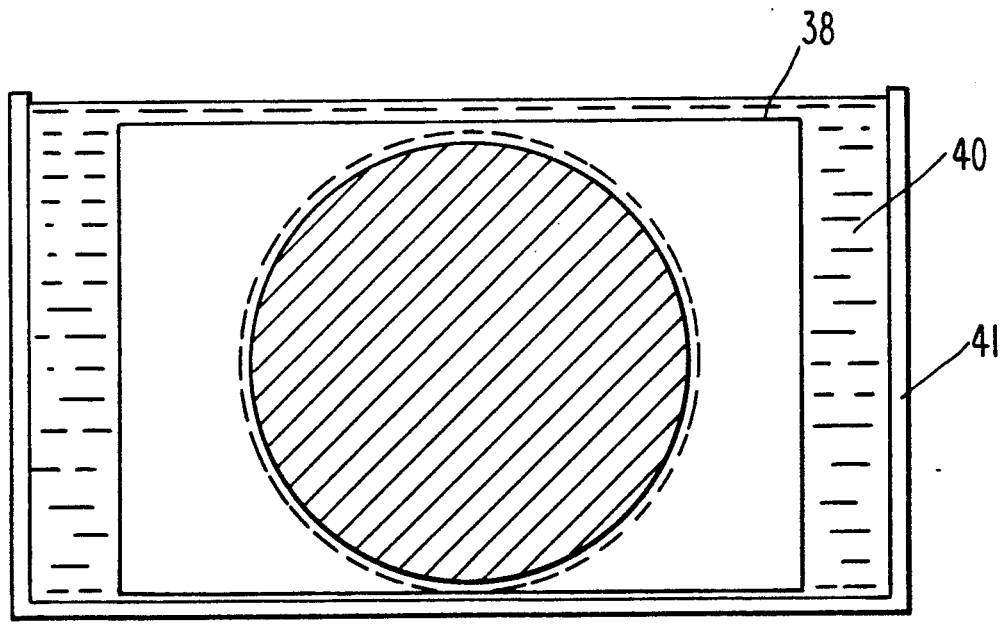
Figure 8A:
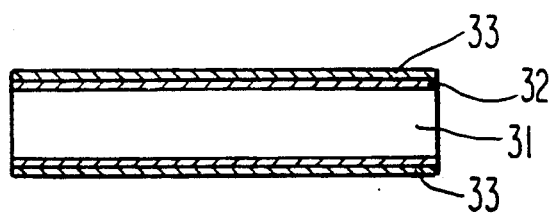
FIG. 8(a) is a sectional view showing a layered substrate formed in the step of FIGS. 7(a) and 7(b)

Next, as shown in FIGS. 7(a) and 7(b), the ceramic substrate 31 layered with the zinc oxide layer 32 was immersed in a Pd catalytic solution 40 (a palladium sulfate solution), and ultraviolet light rays 42 from an ultraviolet light lamp (not shown) were radiated to both surfaces of the zinc oxide layer 32 through two photomasks 38 and 39 having a circle electrode pattern. The portion inside the circle of each photomask was made non-transparent to light so that a Pd layer 33 could be formed on that portion as shown in FIG. 8(a), while the irradiated portion of the zinc oxide layer was dissolved into the solution.

Figure 8B:
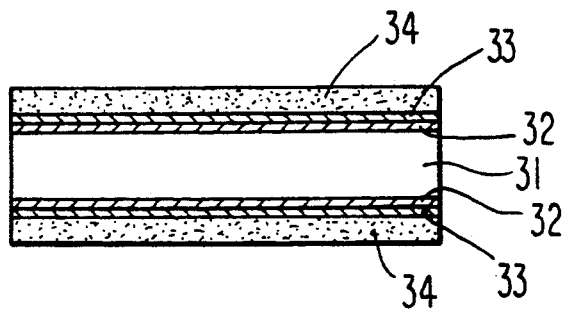
FIG. 8(b) is a sectional view showing the layered substrate of FIG. 8(a) with electrodes formed thereon.

Then, the ceramic substrate 31 with the patterned Pd thereon was immersed in an electroless plating copper solution to have copper deposited on the Pd layer as shown in FIG. 8(b). The copper layer was thickened by electroplating in the same manner as Example 7.

The adhesion strength and electrical characteristics of the electrode of the ceramic capacitor obtained in this example were tested, and approximately the same excellent characteristics as those of Example 7 were obtained.

EXAMPLE 9

In this example, a ceramic capacitor was manufactured by the same method as shown in Example 8, except that tungsten oxide, in place of zinc oxide, was used as an n-type oxide semiconductor. The manufacturing method of this example is described as follows.

First, the ceramic substrate used in Example 8 was immersed in an peroxopolytungstate solution, and then heated to 180° C. in the atmosphere to have a tungsten oxide layer as an n-type semiconductor formed thereon.

Then, as shown in FIG. 7(a) and 7(b), the ceramic substrate with the tungsten oxide layer formed thereon was immersed in a Pd catalytic solution, and ultraviolet light rays were radiated to both surfaces of the tungsten oxide layer through photomasks having a desired electrode pattern. As a result, the irradiated portion of the tungsten oxide layer was dissolved while Pd was deposited on the other portion thereof which had not been exposed to light. Subsequently, the layered substrate was immersed in an electroless plating copper solution to have copper deposited on the Pd layer. The copper layer was thickened by electroplating.

The ceramic capacitor obtained in this example was tested as described in Example 7, and showed substantially the same results as those of Example 8.

EXAMPLE 10

In this example, a ceramic capacitor was manufactured using titanium oxide as an n-type oxide semiconductor and copper as a conductive electrode. The manufacturing method is described as follows.

First, the ceramic substrate used in Example 7 was immersed in a 50% titanium tetraisopropoxide/isopropyl alcohol, cleaned by immersing in distilled water, and then fired at 450° C. to have a titanium oxide layer formed thereon.

Then, the layered substrate was immersed in a palladium catalytic solution, and irradiated with ultraviolet light through the same photomasks as used in Example 9. As a result, palladium was deposited on the portion of the substrate which had not been exposed to light. In this case, the light-exposed portion of the titanium oxide layer was not dissolved, remaining on the ceramic substrate. Finally, a copper electrode was formed by electroless plating and electroplating by the same method as described in Examples 7 to 9 to obtain a ceramic capacitor.

The ceramic capacitor obtained in this example was tested, and showed substantially the same results as Example 8.

EXAMPLE 11

An example of a microwave dielectric resonator (ceramic filter) as an electronic component is herein described.

Figure 9:
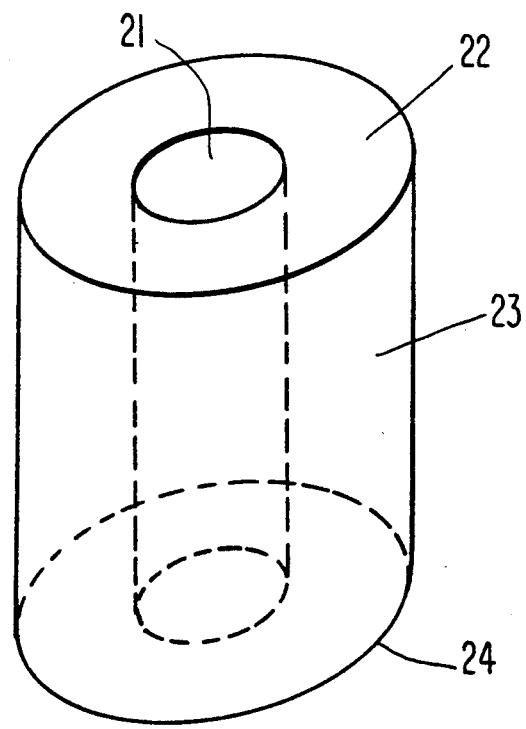
FIG. 9 is a perspective view showing a ceramic material used for a microwave dielectric resonator according to the present invention.

A ceramic material of the $MgTiO_3$—$CaTiO_3$ group having a dielectric constant of 25 and a structure shown in FIG. 9 was used. A copper electrode was formed on this cylindrical ceramic material by the same method as described in FIG. 7; that is, a zinc oxide layer was formed on the inner circumferential face 21, the outer circumferential face 23 and the end faces 22 and 24 of the ceramic material. The layered ceramic material was immersed into a Pd catalytic solution to have Pd deposited on the zinc oxide layer. Then, the ceramic material was immersed into an electroless plating solution to have copper deposited on the Pd layer and further immersed into an electroplating solution to thicken the copper layer. The deposited copper layer on the end face 24 was removed by cutting and polishing and tuned so as to be a filter for a resonator. The resonator manufactured in this way showed a high Q value of 975, and the adhesion strength of the copper electrode to the ceramic material was 2.5 kg/mm$^2$.

To confirm the characteristics of the microwave dielectric resonator of this example, a conventional microwave dielectric resonator was used as a comparative example.

The comparative example was manufactured by the following method. First, the same ceramic material as used in this example was degreased with an alkaline solution (10% NaOH solution) and then the surface of the material was roughened with a hydrofluoric acid solution (HP—$HNO_3$ mixed solution). Next, after good washing with water, the material was immersed in a tin chloride solution (40 grams of $SnCl_2.2H_2O$ added in 70 ml of HCL and diluted with 1 l of water) for sensitizing treatment. Then, the material was immersed in a palladium chloride solution (a 300 mg/l palladium chloride solution adjusted to pH 5 by hydrochloric acid) for one minute and then in a 10% formalin solution to reduce and activate palladium. Then, the thus treated material was immersed first in the electroless plating solution used in Example 7 to have copper deposited on the surface, and then in a copper pyrophosphate solution to thicken the copper layer by electroplating, to produce a resonator. The resonator thus obtained showed a Q value of 860 and the adhesion strength of the electrode was about 1.25 kg/mm$^2$.

By the results of this example and the comparative example, the microwave dielectric resonator of this example was proved to have excellent characteristics.

In this specification, examples of capacitors and a microwave dielectric resonator were described. However, it should be appreciated that other electronic components such as a radio frequency circuit substrate and a microwave integrated circuit element can also be manufactured by the method described hereinbefore.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An electronic component comprising a dielectric layer, a metal oxide semiconductor layer as a photosensitive material formed on the dielectric layer, and a first and a second electrodes interposing the dielectric layer and the metal oxide semiconductor layer.

2. An electronic component according to claim 1, wherein the electronic component is a capacitor.

3. An electronic component according to claim 2, wherein the first electrode is an aluminum substrate, and the dielectric layer is an aluminum oxide layer formed on the aluminum substrate.

4. An electronic component according to claim 3, wherein the oxide semiconductor layer is formed by thermal decomposition of an organic metal compound.

5. An electronic component according to claim 3, wherein the metal oxide semiconductor layer is a zinc oxide layer.

6. An electronic component according to claim 5, wherein a manganese dioxide layer is formed between the aluminum oxide layer and the zinc oxide layer.

7. An electronic component according to claim 6, wherein the second electrode is copper.

8. An electronic component according to claim 6, wherein the second electrode is conductive carbon.

9. An electronic component according to claim 6, wherein the second electrode is a layered structure of a conductive polymer layer and a conductive carbon layer.

10. An electronic component according to claim 3, wherein the metal oxide semiconductor layer is a tungsten oxide layer.

11. An electronic component according to claim 3, wherein the metal oxide semiconductor layer is a titanium oxide layer.

12. An electronic component according to claim 2, wherein an electroless plating catalyst layer is formed between the metal oxide semiconductor layer and the second electrode.

13. An electronic component according to claim 12, wherein the electroless plating catalyst is palladium.

14. An electronic component according to claim 1, wherein the dielectric layer is ceramic.

15. An electronic component according to claim 14, wherein the dielectric layer is ceramic and the electronic component is a capacitor.

16. An electronic component according to claim 14, wherein the electronic component is a microwave dielectric resonator.

17. A method for manufacturing an electronic component comprising the steps of:
  forming a dielectric layer and a metal oxide semiconductor layer as a photosensitive material on an electrode substrate in this order;
  immersing the layered substrate in an electroless plating catalytic solution so as to deposit the electroless plating catalyst on the metal oxide semiconductor layer; and
  forming an electrode on the deposited catalyst.

18. A method according to claim 17, wherein the immersing step includes irradiating the metal oxide semiconductor layer with light having energy greater than the band gap thereof through a mask having a pattern so as to deposit the electroless plating catalyst in the pattern of the mask.

19. A method according to claim 17, wherein the electronic component is a capacitor.

20. A method according to claim 17, wherein the electrode substrate is a conductive metal substrate, and the dielectric layer is an oxide layer obtained by oxidation of the conductive metal.

21. A method according to claim 17, wherein the dielectric layer is a ceramic layer.

22. A method according to claim 17, wherein the electroless plating catalyst is palladium.

23. A method according to claim 17, wherein the metal oxide semiconductor layer is formed on the dielectric layer by thermal decomposition of an organic metal compound.

24. A method according to claim 17, wherein the electrode is formed by depositing metal on the deposited catalyst by immersing the layered substrate in an electroless plating solution.

25. A method according to claim 17, wherein the electrode is formed by applying conductive carbon to the deposited catalyst by screen printing.

26. A method for manufacturing an electronic component comprising the steps of:
    forming a dielectric layer and a metal oxide semiconductor layer as a photosensitive material on an electrode substrate in this order; and
    immersing the layered substrate in an electroless plating solution containing a monomer under irradiation of light having energy greater than the band gap of the metal oxide semiconductor layer through a mask having a pattern so as to deposit a conductive polymer on a predetermined portion of the metal oxide semiconductor layer.

27. A method according to claim 26, wherein the electronic component is a capacitor.

28. A method according to claim 26, wherein the metal oxide semiconductor layer is a titanium oxide layer, and the monomer is pyrrole.

* * * * *

UNITED STATES PATENT AND TRADEMARK OFFICE
CERTIFICATE OF CORRECTION

PATENT NO. : 5,126,921
DATED : June 30, 1992
INVENTOR(S) : Fujishima, et al.

It is certified that error appears in the above-indentified patent and that said Letters Patent is hereby corrected as shown below:

On the title page, item (73):

Please add --Matsushita Electric Industrial Co., Ltd.-- to the Assignees.

Signed and Sealed this

Seventh Day of September, 1993

Attest:

BRUCE LEHMAN

*Attesting Officer*    *Commissioner of Patents and Trademarks*